United States Patent
Kim et al.

(10) Patent No.: US 11,694,893 B2
(45) Date of Patent: Jul. 4, 2023

(54) SEMICONDUCTOR MANUFACTURING PARTS COMPRISING SIC DEPOSITION LAYER, AND MANUFACTURING METHOD THEREFOR

(71) Applicant: Tokai Carbon Korea Co., Ltd., Anesong-si (KR)

(72) Inventors: Joung Il Kim, Gyeonggi-do (KR); Ki Won Kim, Gyeonggi-do (KR); Jong Hyun Kim, Gyeonggi-do (KR)

(73) Assignee: TOKAI CARBON KOREA CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/466,156

(22) PCT Filed: Dec. 18, 2017

(86) PCT No.: PCT/KR2017/014907
§ 371 (c)(1),
(2) Date: Jun. 3, 2019

(87) PCT Pub. No.: WO2018/117559
PCT Pub. Date: Jun. 28, 2018

(65) Prior Publication Data
US 2020/0066514 A1 Feb. 27, 2020

(30) Foreign Application Priority Data

Dec. 20, 2016 (KR) .......... 10-2016-0174856
Dec. 12, 2017 (KR) .......... 10-2017-0170791

(51) Int. Cl.
*H01L 21/02* (2006.01)
*H01L 21/687* (2006.01)
*H01L 29/16* (2006.01)

(52) U.S. Cl.
CPC .... *H01L 21/02529* (2013.01); *H01L 21/0262* (2013.01); *H01L 21/68771* (2013.01); *H01L 29/1608* (2013.01)

(58) Field of Classification Search
CPC .......... H01L 21/02529; H01L 21/0262; H01L 21/68771; H01L 29/1608; H01L 21/02376;
(Continued)

(56) References Cited

U.S. PATENT DOCUMENTS 5,576,058 A 11/1996 Norrgrann et al.
5,705,262 A * 1/1998 Bou .................... C04B 41/5059
384/907
(Continued)

FOREIGN PATENT DOCUMENTS

JP H01125819 A * 5/1989 ......... C23C 16/4581
JP H01125819 A 5/1989
(Continued)

*Primary Examiner* — Nduka E Ojeh
*Assistant Examiner* — Laura M Dykes
(74) *Attorney, Agent, or Firm* — Armstrong Teasdale LLP

(57) ABSTRACT

The present invention relates to semiconductor manufacturing parts used in a dry etching process. Semiconductor manufacturing parts comprising a SiC deposition layer, of the present invention, comprises: a base material; and a SiC deposition layer formed on the surface of the base material, wherein the thickness ratio of the base material and the SiC deposition layer is 2:1 to 100:1.

12 Claims, 3 Drawing Sheets

(58) Field of Classification Search
CPC ........... H01L 21/02378; H01L 21/0243; H01L 21/68757; H01L 21/02167; H01L 21/02269; H01L 21/02293; H01L 21/02447; H01L 21/205; H01L 21/3065; H01L 21/324; H01L 21/67069
USPC .......................................................... 257/77
See application file for complete search history.

(56) References Cited

U.S. PATENT DOCUMENTS

| | | | |
|---|---|---|---|
| 6,117,573 A | 9/2000 | Nishioka et al. | |
| 2001/0001384 A1* | 5/2001 | Arai | C30B 25/12 117/84 |
| 2009/0125109 A1* | 5/2009 | Gillesberg | C25D 17/005 623/16.11 |
| 2009/0314211 A1* | 12/2009 | Du Bois | H01L 21/68742 118/729 |
| 2011/0076401 A1 | 3/2011 | Chao et al. | |
| 2011/0104884 A1 | 5/2011 | Koshiishi et al. | |
| 2013/0029158 A1* | 1/2013 | Aigo | H01L 21/02433 428/446 |
| 2013/0112997 A1* | 5/2013 | Kawamoto | H01L 29/1608 257/77 |
| 2013/0168697 A1* | 7/2013 | Kim | H01L 21/02376 257/77 |
| 2013/0252424 A1* | 9/2013 | Lin | F27D 5/0037 438/689 |
| 2015/0321966 A1 | 11/2015 | Shinohara et al. | |
| 2016/0115623 A1 | 4/2016 | Ito | |
| 2018/0114716 A1* | 4/2018 | Hao | H01L 21/68785 |
| 2018/0308737 A1* | 10/2018 | Moriya | H01L 21/6833 |

FOREIGN PATENT DOCUMENTS

| | | | |
|---|---|---|---|
| JP | H0648872 A | | 2/1994 |
| JP | H06263569 A | | 9/1994 |
| JP | 07058029 A | * | 3/1995 |
| JP | H10209061 A | | 8/1998 |
| JP | H11131236 A | | 5/1999 |
| JP | 2001199791 A | | 7/2001 |
| JP | 2001203191 A | | 7/2001 |
| JP | 2003045812 A | * | 2/2003 |
| JP | 2003086518 A | | 3/2003 |
| JP | 2004296778 A | | 10/2004 |
| JP | 2007149771 A | * | 6/2007 |
| JP | 2008277781 A | | 11/2008 |
| KR | 20120102548 A | | 9/2012 |
| KR | 20130049449 A | | 5/2013 |
| KR | 200476554 Y1 | | 3/2015 |
| KR | 20160007559 A | | 1/2016 |
| KR | 101593921 B1 | | 2/2016 |
| KR | 101593922 B1 | | 2/2016 |
| KR | 101628689 B1 | | 6/2016 |
| WO | 2014196323 A1 | | 11/2014 |

* cited by examiner

SEMICONDUCTOR MANUFACTURING PARTS COMPRISING SIC DEPOSITION LAYER, AND MANUFACTURING METHOD THEREFOR

TECHNICAL FIELD

Example embodiments relate to a semiconductor manufacturing part used in a dry etching process, and more particularly, a semiconductor manufacturing part including a SiC deposition layer having an excellent plasma resistance characteristic and a manufacturing method thereof.

BACKGROUND ART

In general, a plasma processing method used in a semiconductor manufacturing process is one of dry etching processes through which a target is etched using gas. This method may include injecting etching gas into a reaction vessel and ionizing it, accelerating it to a wafer surface, and physically and chemically removing the wafer surface. The method is widely used because it is easy to control etching and is highly productive, and enables a formation of a fine pattern of tens of nanometers (nm).

Various semiconductor manufacturing parts including a focus ring in a dry etching device may be used to allow plasma to be concentrated around a wafer on which an etching process is performed in a reaction vessel under an unfavorable condition in the presence of plasma. Herein, such a part itself may be exposed to plasma and thus damaged. Thus, researches have been continuously conducted to increase plasma resistance of a semiconductor manufacturing part. As one of such researches, there is a research on a method of manufacturing a part, such as a focus ring or an electrode of a SiC material instead of using a Si material.

Here, the SiC material is relatively high cost compared to a graphite material, which may lead to increasing product cost. In particular, in the case of producing a semiconductor manufacturing product, price of the SiC material becomes an issue, which may cause a degradation in productivity.

DISCLOSURE OF INVENTION

Technical Goals

Example embodiments provide a method for manufacturing a semiconductor manufacturing part using a simple method without a need to significantly increase production cost.

However, the example embodiments are not limited to what is described above, and it is thus obvious to those skilled in the art that other tasks not described herein may also be achieved from the example embodiments to be described hereinafter.

Technical Solutions

According to the present disclosure, there is provided a semiconductor manufacturing part including a SiC deposition layer, the semiconductor manufacturing part including a base material; and a SiC deposition layer formed on the base material. A thickness ratio of the base material and the SiC deposition layer is 1:1 to 100:1.

According to an example embodiment, the base material may include at least one selected from a group consisting of graphite, reaction sintered SiC, pressureless sintered SiC, hot press SiC, recrystallized SiC, and CVD SiC.

According to an example embodiment, the base material may be in a stepped structure having a step, and a cross-section of the step may include a curved surface or surfaces of the step form an obtuse angle.

According to an example embodiment, a thickness of the SiC deposition layer may be 2 mm to 20 mm.

According to an example embodiment, the SiC deposition layer may include a plurality of layers.

According to an example embodiment, a thickness of the SiC deposition layer formed on at least one surface of the base material may be 1.5 to 3 times compared to that of the SiC deposition layer formed on a surface opposite to the one surface of the base material.

According to the present disclosure, there is provided a method of manufacturing a semiconductor manufacturing part including a SiC deposition layer, the method including preparing a base material including at least one selected from a group consisting of graphite, reaction sintered SiC, pressureless sintered SiC, hot press SiC, recrystallized SiC, and CVD SiC; and forming the SiC deposition layer on the base material.

According to an example embodiment, a thickness ratio of the base material and the SiC deposition layer may be 1:1 to 100:1.

According to an example embodiment, the forming of the SiC deposition layer may be performed using a chemical vapor deposition (CVD) method.

According to an example embodiment, the forming of the SiC deposition layer may be performed at a temperature of 1000° C. to 1900° C.

According to an example embodiment, the forming of the SiC deposition layer may be performed under condition in which a temperature at a start of deposition is higher than a temperature at an end of deposition.

According to an example embodiment, the forming of the SiC deposition layer may be performed with sequentially increasing a temperature while forming the SiC deposition layer.

According to an example embodiment, the forming of the SiC deposition layer may be performed a plurality of number of times.

According to an example embodiment, the semiconductor manufacturing part manufacturing method may further include performing a residual stress removal operation of performing heat treatment at 1500° C. to 2000° C. after forming the SiC deposition layer.

According to an example embodiment, the base material may be mounted to a jig and the jig is in a tapered shape and have a width extending in a direction in which the jig contacts with a surface of the base material.

Advantageous Effects

A semiconductor manufacturing part including a SiC deposition layer according to example embodiments may be manufactured through a method of including a base material and forming the SiC deposition layer with a relatively thin thickness on the base material, thereby decreasing relatively high product cost and enhancing a productivity.

Also, although the SiC deposition layer included in the semiconductor manufacturing part is formed with the relatively thin thickness, the base material may not be exposed to plasma. Accordingly, it is possible to prevent a degradation in quality of goods when manufacturing a semiconductor product through a dry etching process by plasma.

BEST MODE FOR CARRYING OUT THE INVENTION

Figure 1:
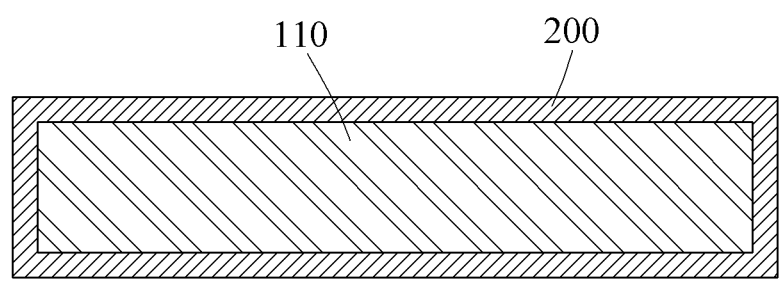
FIG. 1 is a cross-sectional view of a semiconductor manufacturing part in which a SiC deposition layer is formed on a base material according to an example embodiment.

Hereinafter, example embodiments will be described with reference to the accompanying drawings, wherein like reference numerals refer to the like elements throughout.

However, various changes, modifications, and equivalents of the methods, apparatuses, and/or systems described herein will be apparent after an understanding of the disclosure of this application. The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular embodiments only and is not intended to be limiting the present disclosure. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, operations, elements, and/or components, but do not preclude the presence or addition of one or more other features, integers, operations, elements, components, and/or groups thereof.

Unless otherwise defined, all terms, including technical and scientific terms, used herein have the same meaning as commonly understood by one of ordinary skill in the art to which this disclosure pertains based on an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Reference will now be made in detail to the example embodiments. Regarding the reference numerals assigned to the elements in the drawings, it should be noted that the same elements will be designated by the same reference numerals, wherever possible, even though they are shown in different drawings. Also, in the description of the example embodiments, detailed description of well-known related structures or functions will be omitted when it is deemed that such description will cause ambiguous interpretation of the present disclosure.

FIG. 1 is a cross-sectional view of a semiconductor manufacturing part in which a SiC deposition layer 200 is formed on a base material 110 according to an example embodiment. Referring to FIG. 1, the SiC deposition layer 200 formed with a relatively thin thickness is formed on the base material 110 formed with a relatively thick thickness. According to an aspect, the semiconductor manufacturing part may include the base material and the base material corresponds to a most thickness of the semiconductor manufacturing part.

A semiconductor manufacturing part including a SiC deposition layer according to the present disclosure may include base material; and a SiC deposition layer formed on the base material. A thickness ratio of the base material and the SiC deposition layer is 1:1 to 100:1.

According to an aspect, deposition is performed including the base material 110. According to an example embodiment, to manufacture the semiconductor manufacturing part including the SiC deposition layer 200, the base material is formed with a relatively thick thickness and the SiC deposition layer is formed with a relatively thin thickness. Here, the thickness ratio of the base material and the SiC deposition layer may be 1:1 to 100:1. When a ratio of the base material over the thickness of the SiC deposition layer is less than 1, the thickness of the SiC deposition layer may increase, which may lead to increasing production cost. Also, when the ratio exceeds 100, the SiC deposition layer may have a significantly thin thickness, which may cause the base material to be exposed to plasma.

Here, the thickness of the SiC deposition layer indicates a sum of vertical lengths of thicknesses deposited on and below the base material. Here, the thickness of the base material denotes a vertical length at any positions although the base material is not in a rectangular block shape but in a stepped structure.

According to an example embodiment, the base material may include at least one of graphite, reaction sintered SiC, pressureless sintered SiC, hot press SiC, recrystallized SiC, and CVD SiC. Components of the base material may be components that are not easily separable from the SiC deposition layer. Any material easily inseparable from the SiC layer formed on the base material may be further included as an additional component.

According to an example embodiment, the base material may be in a stepped structure having a step. For example, the semiconductor manufacturing part may be a focus ring and the semiconductor manufacturing part may be in a stepped structure having a step based on specifications and characteristics of a semiconductor manufacturing apparatus to which the semiconductor manufacturing part applies. Accordingly, the base material used to manufacture such part may include the stepped structure having the step.

Figure 2:
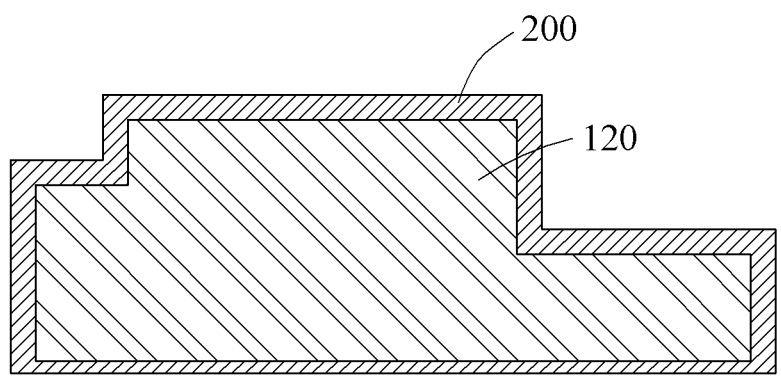
FIG. 2 is a cross-sectional view of a semiconductor manufacturing part in which a SiC deposition layer is formed on a base material including a stepped structure according to an example embodiment.

FIG. 2 is a cross-sectional view of the semiconductor manufacturing part in which the SiC deposition layer 200 is formed on a base material 120 in a stepped structure having a step according to an example embodiment.

According to an example embodiment, a cross-section of the step may include a curved surface or surfaces constituting the step may form an obtuse angle.

Figure 3:
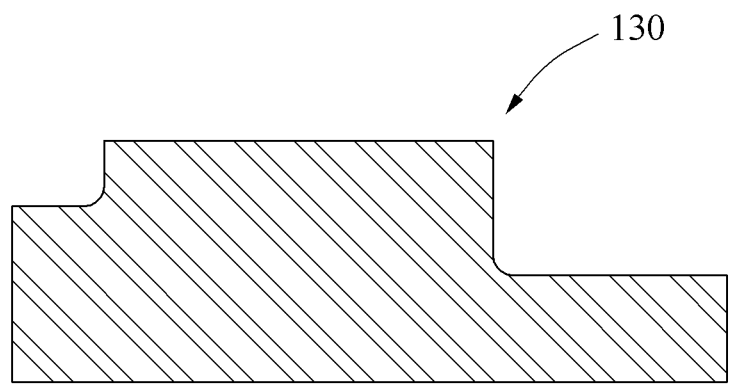
FIG. 3 is a cross-sectional view of a base material in which a cross-section of a step includes a curved surface according to an example embodiment.
Figure 4:
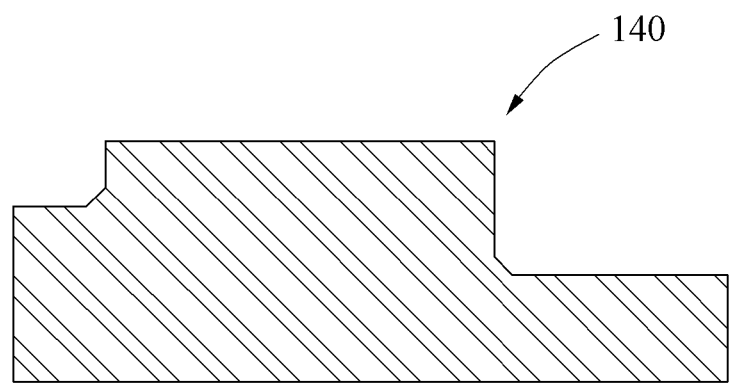
FIG. 4 is a cross-sectional view of a base material in which a cross-section of a step is formed at an obtuse angle according to another example embodiment.

FIG. 3 is a cross-sectional view of a base material 130 of which a cross-section of a step includes a curved surface according to an example embodiment. Referring to FIG. 3, the base material is formed such that the cross-section of the step may include the curved surface. FIG. 4 is a cross-sectional of a base material 140 of which a cross-section of a step is formed at an obtuse angle according to another example embodiment. Referring to FIG. 4, the base material is formed such that the cross-section of the step is formed at the obtuse angle.

According to an example embodiment, the forming of the SiC deposition layer may be performed through a chemical vapor deposition (CVD) process. Here, in the CVD process, deposition gas may not readily enter a concave portion due to a surrounding surface thereof and thus, relatively less deposition may be performed on the concave portion, which may cause a degradation in uniformity of the SiC deposition layer formed on the base material. Therefore, the step of the stepped structure may include a curved surface or surfaces of the step may form an obtuse angle. Through a structure in which the stepped structure is formed using the curved surface or the obtuse angle, further homogenous deposition may be performed on the base material.

According to an example embodiment, a thickness of the SiC deposition layer may be 2 mm to 20 mm. The SiC deposition layer is etched when the SiC deposition layer is exposed from plasma. Here, although the SiC deposition layer is etched, the SiC deposition layer may need to be formed not to expose the base material. The base material is vulnerable to plasma. Thus, when the base material is directly exposed to plasma, particles may be scattered, which may greatly degrade the quality of a semiconductor product. Accordingly, considering a thickness of the SiC deposition layer to be etched in a typical dry etching device, the thickness of the SiC deposition layer may be 2 mm to 20 mm.

According to an example embodiment, the SiC deposition layer may include a plurality of layers. The SiC deposition layer may be formed using not a single layer but a plurality of layers. In the case of forming a single SiC layer using a CVD method, a growth of abnormal tissue may be expanded, which may lead to degrading the quality of goods. Accordingly, the SiC deposition layer may be formed using a plurality of layers at a relatively thin thickness.

According to an example embodiment, a thickness of the SiC deposition layer formed on at least one surface of the base material may be 1.5 to 3 times compared to that of the SiC deposition layer formed on a surface opposite to the one surface of the base material. Here, the SiC deposition layer may have a different thickness depending on a surface on which the SiC deposition layer is to be formed on the base material. The SiC deposition may be formed to have a relatively thick thickness on a surface that is directly exposed to plasma, however, may not be formed to have a relatively thick thickness on a surface that is not directly exposed to plasma. Therefore, considering productivity of goods, the surface corresponding to the relatively thick thickness and the surface corresponding to the relatively thin thickness may be differentially formed. A thickness ratio of the SiC deposition layer formed on the one surface over the SiC deposition layer formed on the opposite surface may be 1.5 to 3 times.

A method of manufacturing a semiconductor manufacturing part including a SiC deposition layer according to the present disclosure includes preparing a base material including at least one of graphite, reaction sintered SiC, pressureless sintered SiC, hotpress SiC, recrystallized SiC, and CVD SiC; and forming the SiC deposition layer on the base material.

According to an aspect, the manufacturing method includes forming the SiC deposition layer on the base material. Components of the base material may be components that are not easily separable from the SiC deposition layer. Any material easily inseparable from the SiC layer formed on the base material may be further included as an additional component.

According to an example embodiment, a thickness ratio of the base material and the SiC deposition layer may be 1:1 to 100:1.

According to an example embodiment, the forming of the SiC deposition layer may be performed using a CVD method. Although the SiC deposition layer may be formed using various methods, the SiC deposition layer may be performed using the CVD method herein.

According to an example embodiment, the forming of the SiC deposition layer may be performed at a temperature of 1000° C. to 1900° C. The SiC deposition layer may be formed in a chamber at a high temperature. When the temperature is less than 1000° C., a deposition speed and productivity of goods may be degraded due to the low temperature. Conversely, when the temperature exceeds 1900° C., exfoliation may occur due to an increase in internal stress.

According to an example embodiment, the forming of the SiC deposition layer may be performed under condition in which a temperature at a start of deposition is higher than a temperature at an end of deposition. Since the deposition is performed with increasing the temperature, the deposition is performed at a relatively low temperature in an initial stage, which may lead to reducing internal stress. Although a deposition speed is relatively low, the deposition may be uniformly performed over the entire surface of the base material at a relatively low temperature without a deposition-free portion. Subsequently, the deposition may be performed by increasing a temperature and a deposition speed. Here, since the initially deposited SiC deposition material and a SiC deposition material to be newly deposited are the same component, the SiC deposition material to be newly deposited may be uniformly attached even at the increased deposition speed. Therefore, although the SiC component is deposited on the SiC deposition layer uniformly formed in the initial stage at a relatively high deposition speed, the deposition may be uniformly performed. As described above, the uniform deposition layer may be formed at a relatively low temperature in the initial stage and the deposition layer may be quickly formed by increasing the temperature. Accordingly, it is possible to reduce the internal stress during a deposition process, to prevent exfoliation, and to maintain productivity of goods.

According to an example embodiment, the forming of the SiC deposition layer may be performed with sequentially increasing a temperature while forming the SiC deposition layer. That is, the temperature may be sequentially increased while forming the SiC deposition layer. Here, the sequential increase of the temperature may indicate continuously increasing the temperature slowly or increasing the temperature by maintaining a desired temperature during a desired period of time and then maintaining a higher temperature during a desired period of time.

According to an example embodiment, the forming of the SiC deposition layer may be performed a plurality of number of times. As described above, to suppress a growth of abnormal tissue, the SiC deposition layer may be provided in a structure in which a plurality of layers is stacked. Here, the plurality of layers may be formed by performing a process of depositing the SiC deposition layer a plurality of number of times.

According to an example embodiment, the semiconductor manufacturing part manufacturing method may further include performing a residual stress removal operation of performing heat treatment at 1500° C. to 2000° C. after forming the SiC deposition layer. Since the forming of the SiC deposition layer is performed in a high-temperature confined space, internal stress may be formed and the formed internal stress may remain although the deposition is terminated. Such residual stress may cause the degradation in quality of goods. Here, the residual stress may be removed by performing heat treatment at 1500° C. to 2000° C. When the temperature is less than 1500° C., the stress may not be effectively removed. When the temperature exceeds 2000° C., the significantly high temperature may cause a change in SiC, which may lead to increasing the residual stress and further exfoliating the SiC deposition layer from the base material.

Figure 5:
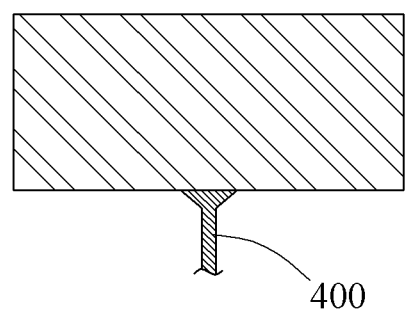
FIG. 5 is a cross-sectional view illustrating a structure in which one surface of a base material is stably supported by a jig in a tapered shape according to an example embodiment.

FIG. 5 is a cross-sectional view illustrating a structure in which one surface of a base material is stably supported by a jig 400 in a tapered shape according to an example embodiment.

According to an example embodiment, the base material may be mounted to the jig 400 and the jig may be in a tapered shape and have a width extending in a direction in which the jig contacts with a surface of the base material. During a process of forming a SiC deposition layer on the base material, deposition may be performed with supporting the base material using the jig. Here, the jig may occlude the surface of the base material from SiC deposition gas, which may prevent the deposition layer from being formed with homogenous quality. Accordingly, the jig may contact the base material with a possibly small area not to interrupt the SiC deposition.

However, when the jig contacts the base material with a significantly small area, a stability issue may arise when the jig supports the base material during the deposition process. When the base material is not stably supported, it may cause the base material to shake during the deposition process, which may lead to failing in forming the homogenous deposition layer.

Therefore, the jig described herein may stably support the base material although the jig relatively greatly occludes a contact portion between the jig and the base material, and may also relatively less occlude a portion relatively away from the base material from SiC deposition gas. That is, the jig may be formed in a tapered shape. Thus, the stable support structure may be provided since the contact portion between the jig and the base material is in contact with the jig with a relatively large area. Also, the external surface of the deposition layer that is directly exposed to plasma may be relatively less occluded by the jig compared to the surface layer portion of the base material. Accordingly, it is possible to stably form the SiC deposition layer and to maintain an excellent plasma resistance characteristic of the SiC deposition layer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

The invention claimed is:

1. A semiconductor manufacturing part comprising a SiC deposition layer, the semiconductor manufacturing part comprising:
   a base material; and
   the SiC deposition layer formed on the base material,
   wherein a thickness ratio of the base material and the SiC deposition layer is 1:1 to 100:1, wherein the base material is in a stepped structure having a step above at least two base portions on at least two opposite sides of the step, and each base portion comprising a top above a vertical side,
   wherein a cross-section of the step comprises at least two bent surfaces, each bent surface projecting, at least partially, in a vertically upward direction from the top of each corresponding base portion, each bent surface forming obtuse angles with both the top of the corresponding base portion and the corresponding side of the step, and
   wherein a thickness of the SiC deposition layer formed on an upper surface of the base material is 1.5 to 3 times compared to that of the SiC deposition layer formed on a lower surface of the base material.

2. The semiconductor manufacturing part of claim 1, wherein the base material comprises at least one selected from a group consisting of graphite, reaction sintered SiC, pressureless sintered SiC, hot press SiC, recrystallized SiC, and CVD SiC.

3. The semiconductor manufacturing part of claim 1, wherein a thickness of the SiC deposition layer is 2 mm to 20 mm.

4. The semiconductor manufacturing part of claim 1, wherein the SiC deposition layer comprises a plurality of layers.

5. A method of manufacturing a semiconductor manufacturing part comprising a SiC deposition layer, the method comprising:
   preparing a base material comprising at least one selected from a group consisting of graphite, reaction sintered SiC, pressureless sintered SiC, hot press SiC, recrystallized SiC, and
   CVD SiC; and
   forming the SiC deposition layer on the base material,
   wherein the base material is in a stepped structure having a step above at least two base portions on at least two opposite sides of the step,
   and each base portion comprising a top above a vertical side,
   wherein a cross-section of the step comprises at least two bent surfaces each bent surface projecting, at least partially, in a vertically upward direction from the top of each corresponding base portion, each bent surface forming obtuse angles with both the top of the corresponding base portion and the corresponding side of the step,
   wherein, during the forming of the SiC deposition layer, the base material is mounted on only a jig, wherein the jig has a tapered shape and its width linearly increases in a direction towards a surface contact portion of the base material, and wherein an angle, over which the SiC deposition layer is formed, between a linearly tapered surface of the jig and a bottom surface of the base material is an obtuse angle.

6. The method of claim 5, wherein a thickness ratio of the base material and the SiC deposition layer is 1:1 to 100:1.

7. The method of claim 5, wherein the forming of the SiC deposition layer is performed using a chemical vapor deposition (CVD) method.

8. The method of claim 5, wherein the forming of the SiC deposition layer is performed at a temperature of 1000° C. to 1900° C.

9. The method of claim 5, wherein the forming of the SiC deposition layer is performed under condition in which a temperature at a start of deposition is higher than a temperature at an end of deposition.

10. The method of claim 5, wherein the forming of the SiC deposition layer is performed with sequentially increasing a temperature while forming the SiC deposition layer.

11. The method of claim 5, wherein the forming of the SiC deposition layer is performed a plurality of number of times.

12. The method of claim 5, further comprising:
performing a residual stress removal operation of performing heat treatment at 1500° C. to 2000° C. after forming the SiC deposition layer.

* * * * *